United States Patent [19]

Chuangtian et al.

[11] Patent Number: 4,826,283
[45] Date of Patent: May 2, 1989

[54] LIB$_3$O$_5$ CRYSTAL AND ITS NONLINEAR OPTICAL DEVICES

[75] Inventors: Chen Chuangtian, Fuzhou; Wu Yicheng, Hefei; Jiang Aidong, Fuzhou; Wu Bochang, Fuzhou; You Guming, Fuzhou, all of China

[73] Assignee: Fujian Institute of Research on the Structure of Matter, Chinese Academy of Sciences, Fujian, China

[21] Appl. No.: 205,895

[22] Filed: Jun. 13, 1988

[30] Foreign Application Priority Data

Apr. 14, 1988 [CN] China .............................. 88102084.2

[51] Int. Cl.$^4$ ............................ G02B 6/10; H03F 7/00
[52] U.S. Cl. ............................... 350/96.12; 350/96.34; 350/395; 350/96.13; 307/425; 307/427; 307/428; 307/430
[58] Field of Search ............... 350/96.12, 96.13, 96.34, 350/395; 307/425, 427, 428, 430, 424

[56] References Cited

U.S. PATENT DOCUMENTS

| | | | |
|---|---|---|---|
| 3,262,058 | 7/1966 | Ballman et al. | 330/4.5 |
| 3,328,723 | 6/1967 | Giordmaine et al. | 331/107 |
| 3,665,205 | 5/1972 | Bridenbaugh et al. | 307/425 X |
| 3,679,907 | 7/1972 | Bonner et al. | 307/425 X |
| 3,772,528 | 11/1973 | Anderson | 307/430 |
| 3,842,289 | 10/1974 | Yariv et al. | 350/96.12 |
| 3,949,323 | 4/1976 | Bierlein et al. | 332/7.51 |
| 4,200,808 | 4/1980 | Herbst | 307/425 |
| 4,236,785 | 12/1980 | Papuchon et al. | 350/96.14 |
| 4,349,907 | 9/1982 | Campillo et al. | 307/425 |
| 4,427,260 | 1/1984 | Puech et al. | 307/430 X |
| 4,515,429 | 5/1985 | Smith et al. | 350/96.13 |

OTHER PUBLICATIONS

Uesugi, "Parametric Difference Frequency Generation . . . ", Appl. Phys. Lett., vol. 36, No. 3, 2/80, pp. 178-180.
International Conference on Lasers, No. 15-19, 1987, Xiamen, China.
H. V. Hobden, J. Appln. Phys. 38 (1967) 4365.
Yogyo Kyokaishi (Japan), 88 (1980) 179.
J. Anorg. Allg. Chem. (Germany) 439 (1978).

*Primary Examiner*—William L. Sikes
*Assistant Examiner*—Brian M. Healy
*Attorney, Agent, or Firm*—Armstrong, Nikaido, Marmelstein, Kubovcik & Murray

[57] ABSTRACT

This invention relates to NLO devices made of LiB$_3$O$_5$ crystals, which can be used in a laser system of high power density and relatively large divergence and possess a character of high SHG conversion efficiency. Moreover the NLO devices (including waveguide devices) of this invention are capable of producing coherent harmonics of wavelength below 2000Å and tolerating larger processing error of crystals.

6 Claims, 1 Drawing Sheet

LIB₃O₅ CRYSTAL AND ITS NONLINEAR OPTICAL DEVICES

BACKGROUND OF THE INVENTION

1. Field of the Invention

This invention relates to nonlinear optical (NLO) devices made of single crystals of LiB₃O₅.

2. Background of the Invention a single crystal with non-zero components of the second order polarizability tensor is usually referred to as a NLO crystal. It will produce under the radiation of a laser of high intensity NLO effects such as second harmonic generation (SHG), sum-frequency generation (SFG), difference-frequency generation (DFG) and parametric amplification (OPA). The devices utilizing NLO crystals to achieve effective SHG, up and down conversion and OPA have been described in U.S. Pat. No. 3,262,058, No. 3,328,723, No. 3,747,022.

When input laser power through a NLO crystal is weak, only a small part of the incident energy will be converted into energy of different frequency. The conversion efficiency is derived as follows, $$\eta = Iout/Iin\alpha |Deff|^2 \cdot L^2 \cdot Iin \cdot \text{sinc}^2(K \cdot L/2) \quad (1)$$

where
- Iout—output laser power
- Iin—input laser power,
- Deff—the effective SHG coefficient,
- L—the crystal length,
- $\Delta k = k_3 - (k_1 + k_2)$—the phase mismatch. $\pi/\Delta k$ is defined as the coherence length over which harmonic generation wave and incident wave can remain sufficiently in phase.

The condition that $\Delta k = 0$ hence sinc $(\Delta k\, L/2) = 1$ is called PHASE MATCHING condition. Under the condition the conversion efficiency $\eta$ from fundamental to harmonic generation usually arrives the maximum.

Generally phase matching is of two types:

Type I wherein the two incident waves have the same polarization;

Type II wherein the two incident waves have orthogonal polarization.

Phase matching can generally be achieved in four ways (see U.S. Pat. No. 3,949,323). We usually use the angle tuning method by rotation of the crystal to achieve it.

Two effects place restrictions on phase matching. The first is the so-called WALK-OFF effect which refers to that the phase propagation direction and energy propagation direction of the laser are different because of double refraction. The second is the phase mismatch resulting from the divergence of the incoming beam.

For a uniaxial crystal, phase matching relates exclusively to the angle $\theta$ which is the angle between the optical axis and the propagation direction of the incoming beam. The phase mismatch can be expressed as, $$\Delta k = \left.\frac{\partial \Delta k}{\partial \theta}\right|_{\theta_{pm}} \cdot \delta\theta + \left.\frac{\partial^2 \Delta k}{\partial \theta^2}\right|_{\theta_{pm}} \cdot \delta\theta^2 \quad (2)$$

Formula (2) shows that when $\delta\theta$ deviate from zero $\Delta k$ increases and hence $\theta$ decreases. Generally, the deviation angle $\delta\theta$, at which harmonic generation power reduces to 40.5% or 1/e of the maximum, is defined as the ACCEPTANCE ANGLE. If $$\left.\frac{\partial \Delta k}{\partial \theta}\right|_{\theta_{pm}} = 0,$$

$\Delta k$ does not vary linearly with $\delta\theta$ but rather varies with $(\delta\theta)^2$, so that it will be insensitive to the angle deviation. This condition corresponds that $\theta_{pm} = 90°$ i.e. the propagation is in the plane perpendicular to optical axis. Phase matching under this condition is called "non-critical phase matching" (NCPM).

For a biaxial crystal phase matching relates to both $\theta$ and $\phi$ which are the polar angles of the propagation direction of the incident wave. Therefore $\Delta k$ varies both with $\delta\theta$ and $\delta\phi$. We can measure acceptance angle for $\theta$ with $\phi$ fixed and vice versa. The smaller of the acceptance angles for $\theta$ and $\phi$ is defined as the ACCEPTANCE ANGLE of a biaxial crystal. For detailed discussion of phase matching in a biaxial crystal, the paper [H. V. Hobden, J. Appl. Phys. 38(1967)4365] can be referred.

Until now the commonly used NLO crystals are KDP, Urea, KTP, KB₅O₈·4H₂O et. al. Unfortunately they share the same disadvantages, (1) No capability to generate harmonics of wavelength below 2000 Å, which is of great significance in the laser spectroscopy;

(2) Lower damage thresholds, that of KDP being 7 GW/cm² when the pulse duration is 0.1 ns and the wavelength is 1.0642 μm;

(3) Smaller acceptance angles, that of KDP being 5.0 mrad/cm;

These disadvantages place restrictions to use the NLO devices made of the above crystals in generating harmonics in deep UV range and with an incident laser of high energy intensity and great divergence.

The crystal structure of LiB₃O₅ has been reported in [J. Anorg. Allg. Chem. (Germany) 439(1978)] and [YOGYO KYOKAISHI (Japan), 88(1980)179]. It belongs to the orthorhombic system with the space group Pna2₁. The lattice parameters are respectively 8.446A, 7.378A and 5.141A for a,b,c, and Z=4 in each unit cell. The mass density is 2.478 g/cm³. The largest crystal size reported was 1×1×4 mm³, whcih was not yet large enough for practical use. And also no one has indicated that the crystals of LiB₃O₅ possess NLO properties.

It is the first object of the present invention to provide a NLO device that can convert incident laser with high power density and large divergence into its harmonics with high efficiency;

The second object of the present invention is to provide a NLO device which can generate coherent radiations of wavelength below 2000 Å;

It is the third object of the present invention to provide a NLO device with cross section not smaller than 70×70 mm² which can be employed to generate second harmonics and third harmonics of Nd: YAG laser frequency;

The forth object of the present invention is to provide a waveguide device which can generate coherent radiation of wavelength below 2000 Å.

All of above objects are achieved by the NLO devices employing single crystals of LiB₃O₅. Using the high temperature solution top seeding method the inventors have succeeded in obtaining single crystals of $LiB_3O_5$ of size up to $20 \times 35 \times 9$ mm$^3$ which are obviously large enough for practical use.

The above NLO devices overcome some shortcomings of those employing crystals of KDP, Urea et. al. For example they can work efficiently even when the incoming beam is of high intensity (up to 25 GW/cm$^2$ when $\tau = 0.1$ ns and $\lambda = 1.0642$ $\mu$m) and large divergence (up to tens of mrad), they can also generate coherent UV radiation of wavelength below 2000 Å. It is also possible to make NLO devices with $LiB_3O_5$ crystals of large cross sections (up to $70 \times 70$ mm$^2$).

The inventors have first discovered that crystals of a compound having formula $LiB_3O_5$ possess the NLO properties. The crystals being point group of mm 2 and are therefore biaxial. They are transparent from 0.16 $\mu$m to 2.6 $\mu$m.

For a signle crystal of $LiB_3O_5$ the components of d31, d32, d33, d24 and d15 of the second order polarizability tensor are non-zero. The inventors determined these components by the Maker fringer technique at the fundamental wavelength of 1.0642 $\mu$m.

d31 = $\mp 2.82(1 \pm 0.08) \times 10^{-9}$ esu.
d = $\pm 3.39(1 \pm 0.08) \times 10^{-9}$ esu.
d33 = $\pm 0.53(1 \pm 0.10) \times 10^{-9}$ esu.
d15 = 31
d24 = d32

Employing the least deviation angle method the inventors also measured the principle refractive indices of $LiB_3O_5$ at 16 wavelengths between 0.2537 $\mu$m and 1.0642 $\mu$m. By fitting procedure the Sellmeier equations were obtained.

$$\begin{cases} n_x^2 = 2.4517 - 0.01177/(0.00921 - \lambda^2) - 9.600 \times 10^{-3} \times \lambda^2 \\ n_y^2 = 2.5279 + 0.01652/(0.005459 + \lambda^2) - 0.01137 \times \lambda^2 \\ n_z^2 = 2.5818 - 0.01414/(0.01186 - \lambda^2) - 0.01457 \times \lambda^2 \end{cases} \quad (3)$$

where wavelength $\lambda$ is in $\mu$m.

The inventors measured the angle tuning curves when $\theta \neq 90°$ and $\theta = 90°$. The acceptance angles were determined from the curves to be 25 mrad when $\theta \neq 90°$ and 95 mrad when $\theta = 90°$.

The acceptance angle of a $LiB_3O_5$ crystal is obviously much larger than those of KDP, Urea, KTP crystals that are commonly used in the current optcial technology. This advantage results in the smaller phase mismatch in a $LiB_3O_5$ crystal than those in KDP, Urea, KTP et. al. under the same divergence of the laser. The large acceptance angle also make it possible to tolerate large processing error in enlargement of the cross sections of the crystals by splicing techniques. The error is only limited to a few degrees for $LiB_3O_5$ crystal in contrast with a few minutes for KDP, of which the acceptance angle is only about 1 mrad. A SHG device with large cross sections up to $70 \times 70$ mm$^2$ may be spliced using 9 piece of single crystals of $LiB_3O_5$ of suitable size.

With a mode-locked Nd: YAG laser ($\tau = 0.1$ ns, $\lambda = 1.0642$ $\mu$m) the inventors measured the threshold of a $LiB_3O_5$ crystal to be 25 GW/cm$^2$ which is 3.6 times as large as that of KDP under the same conditions. Therefore NLO devices made of $LiB_3O_5$ crystals can be employed in a laser system of high power or high average power such as laser fusion system.

As the $LiB_3O_5$ crystal is transparent from 2.6 $\mu$m to 0.16 $\mu$m, therefore, the NLO devices made of said crystal can achieve SHG and SFG for the incident laser, the wavelength region of which is located between 0.375 $\mu$m–3.0 $\mu$m.

The inventors once immersed in water at room temperature a polished single crystals of $LiB_3O_5$ grown by the method adopted in our laboratory and observed no change of the surface brightness after one month. This shows that $LiB_3O_5$ crystals are chemically stable and antideliquescent. Therefore NLO devices made of them can work properly without any protection.

DRAWINGS AND DETAILED DESCRIPTION OF THE INVENTION

With the attached drawings the invention is described in detail.

Figure 1:
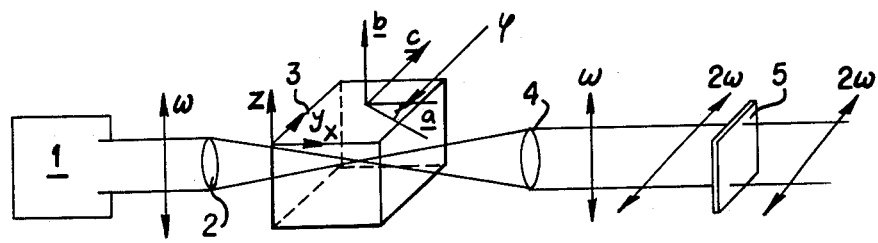
FIG. 1 illustrates the principle of a typlical NLO device made of a single crystal of $LiB_3O_5$.

In FIG. 1 vertically polarized laser of wavelength 1.0642 $\mu$m from a Nd: YAG laser (1) is focused by a lens (2) and then is incident upon a $liB_3O_5$ crystal (3). The crystal is oriented so that the crystallographic b axis is along the polarization direction of the incident beam and the a axis is at angle $\phi$ from the optical path through the crystal. The angle $\phi$ is calculated from the following equations, $$\begin{cases} \eta^{2\omega}(\phi) = \eta_z^\omega \\ \dfrac{1}{\eta^{2\omega}(\phi)^2} = \dfrac{\sin^2\phi}{\eta_x^{2\omega 2}} + \dfrac{\cos^2\phi}{\eta_y^{2\omega 2}} \end{cases} \quad (4)$$

where $\eta_x^{2\omega}$, $\eta_y^{2\omega}$ and $\eta_z^\omega$ can be obtained from formulas (3). The calculation shows that $\phi = 10.73°$ for SHG of a Nd: YAG laser frequency. Light emerging from the crystal (3) is collimated by a collimating lens (4) and passed through a filter (5) to remove the fundamental wave by absorption or reflection. The SHG emerges with horizontal polarization. Removal of lens (2) and/or substitution of filter (5) with a prism does not change the working principle of the NLO device.

Figure 2:
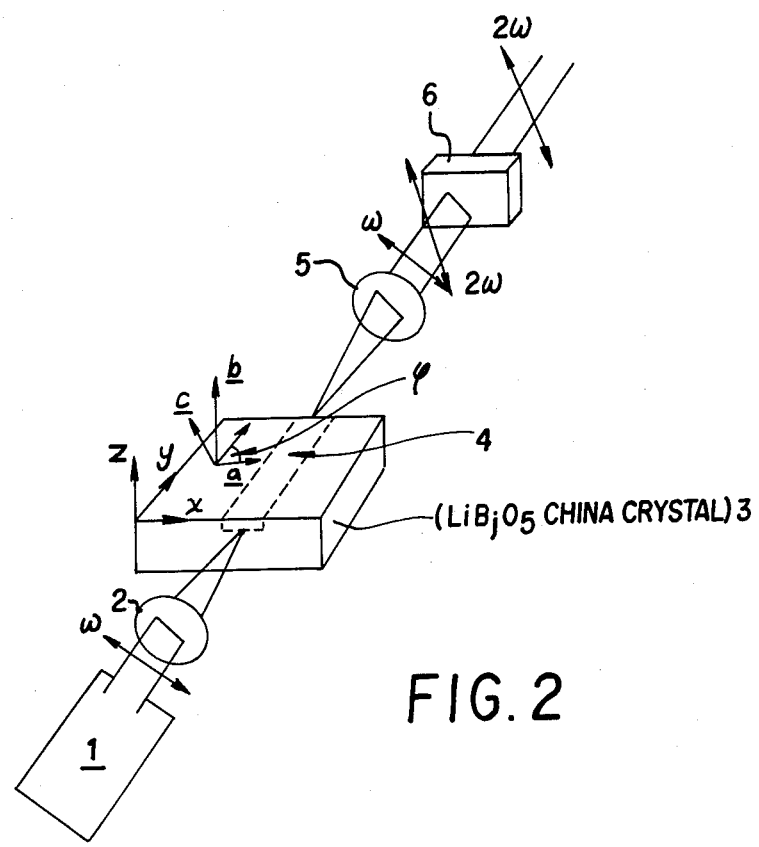
FIG. 2 illustrates the principle of a waveguide device made of a single crystal of $LiB_3O_5$.
Figure 2:
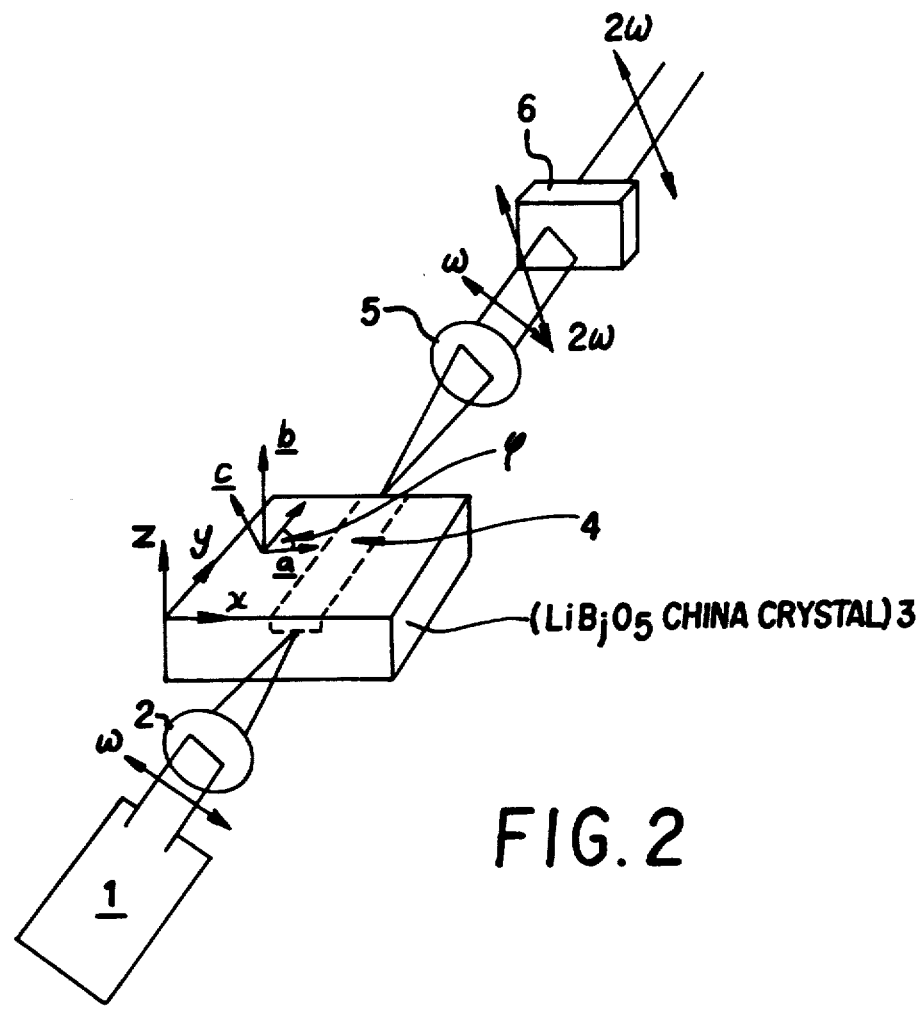

In FIG. 2 there exists a waveguide region (4) on the surface of the crystal (3). This region consists of $Li_{1-x}M_xB_3O_5$ obtained by ion substitution or ion injection techniques (wherein M is alkali matal such as Na, K and x is changed from 0.1 to 0.9). The substrate (3) is oriented so that the crystallographic b axis is along the polarization direction of the incident laser beam and the a axis is at angle $\phi$ from the optical path through the crystal (3). $\phi$ is obtained from formula (4). At angle $\phi = 10.73°$ the SHG of the incident radiation of wavelength 1.0642 $\mu$m memerges from the device shown in FIG. 2. The device works in the following way. Horizontally polarized light from a Nd: YAG laser (1) is focused by a lens (2) and then is incident along the direction shown in FIG. 2 upon the waveguide region (4). The emerging light is collimated by a collimating lens (5) and then passed through a filter (6) to remove the fundamental wave by absorption or reflection. The SHG finally emerges with vertical polarization.

EXAMPLE 1

The experimental set-up and processing were as follows. A Pt. crucible 40 mm in height and 40 mm in diameter was charged by homogeneous mixture of 21.1 g $Li_2CO_3$ and 141.2 g $H_3BO_3$ and then placed in a furnace with ambient material made of $Al_2O_3$ et. al. to keep the temperature. The furnace was then sealed with a cover which is made of also said material and has a hole for the free entrance of seed. The furnace was heated rapidly to a temperature of 950° C. with nickel-chromium heating wire and after 5 hours cooled rapidly to 848° C. A seed made of $LiB_3O_5$ crystal oriented along $C_2$ axis was inserted slowly into the crucible and kept contact with the surface of the melt, maintaining at 848° C. for half an hour. The melt was then cooled rapidly to 833° C. followed reducing slowly the temperature to 780° C. at a rate of 0.5° C./day to end the growth. The obtained crystal was pulled just out of the melt and then cooled to the room temperature at a rate of 40° C./hour. During the growth the seed was kept no rotation. The crystal obtained was a transparent single crystal of $LiB_3O_5$ of size up to $18 \times 20 \times 6$ mm$^3$.

EXAMPLE 2

A Pt. crucible 50 mm in height and 50 mm in diameter filled with homogeneous mixture of 40.6 g $Li_2CO_3$, 203.9 g $H_3BO_3$ and 158.3 g $MoO_3$ was placed in a furnace with $Al_2O_3$ as temperature-keeping material. The furnace was then sealed with a cover which is made of also said material and has a hole for the free entrance of seed. It was heated to 850° C. and then cooled to 673° C. after 5 hours. A seed crystal was inserted slowly into the crucible and kept contact with the surface of the melt for half an hour with no change of temperature and then cooled to 670° C., followed reducing the temperature to 580° C. at a rate of 5° C./day to end the growth. The obtained crystal was pulled just out of the melt and cooled to the room temperature at a rate of 100° C./hour. The final product was a transparent single crystal of $LiB_3O_5$ of size up to $20 \times 35 \times 9$ mm$^3$. During the growth the seed rotated at a rate of 30 rpm.

EXAMPLE 3

Using the procedure of EXAMPLE 1 a raw crystal $15 \times 15 \times 10$ mm$^3$ in dimension was obtained. After determination of the crystallographic axes a, b, and c, it was cut into a crystal of $6 \times 6 \times 6$ mm$^3$ with $\phi = 10.73°$ according to the requirement and orientation indicated in FIG. 1. Then the crystal was placed in the light path also shown in FIG. 1. With a solid state Nd: YAG laser of DCR 2A type made in SPECTROSCOPY PHYSICS (pulse duration 7 ns and beam diameter 4 mm), SHG conversion efficiency of the device up to 59% was achieved without any correction of the reflection on surface when the fundamental energy reached 190 mi/pulse. As a comparison the efficiency is only about 45% in KDP under the same conditions.

EXAMPLE 4

Using the procedure of EXAMPLE 2 a raw crystal $20 \times 20 \times 9$ mm$^3$ in dimension was obtained. After determination of the crystallographic axes a, b, c, it was cut into a crystal $9 \times 9 \times 6$ mm$^3$ in dimension with $\phi = 10.73°$. It was then placed in the optical path shown in FIG. 1. The light source was a Q-modulation Nd: YAG laser with pulse duration 7 ns and beam diameter 6 mm. The SHG conversion efficiency (surface reflection corrected) was measured to be 65% when the input energy reached 195 mj/pulse.

The other kinds of NLO devices such as up and down frequency converters, optical parameteric oscillator made of $LiB_3O_5$ crystals are easily designed and fabricated in the similar ways. They are obviously not beyond the scope of our invention.

We claim:

1. A NLO device comprising means to direct at least one incident beam of electromagnetic radiation into at least one crystal having NLO properties whereby electromagnetic radiation emerging from said crystal contains at least one frequency different from the frequency of any incident beam of radiation, wherein said crystal is a single crystal of $LiB_3O_5$.

2. A NLO device of claim 1 wherein the wavelength of the incident beam of radiation falls in the range 0.375 $\mu$m–2.6 $\mu$m.

3. A NLO device of claim 1 wherein at least $70 \times 70$ mm$^2$ in cross sections is obtained by splicing techniques.

4. A waveguide device comprising means to direct at least one incident beam of electromagnetic radiation into the waveguide region of at least one NLO crystal whereby radiation emerging from said waveguide region contains at least one frequency different from the frequency of any incident beam of radiation, wherein a waveguide region on the surface of said crystal and said crystal is a single crystal of $LiB_3O_5$.

5. A waveguide device of claim 4 wherein said waveguide region consists of $Li_{1-x}M_xB_3O_5$ (M is Na, K, et. al. $0 < x < 1$) obtained by ion substitution or ion injection techniques.

6. A device of any one of claims 1–5 wherein said crystal of $LiB_3O_5$ is grown by high-temperature solution top seeding method.

* * * * *

REEXAMINATION CERTIFICATE (1574th)
United States Patent [19]
Chuangtian et al.

[11] B1 4,826,283
[45] Certificate Issued Oct. 15, 1991

[54] LIB$_3$O$_5$ CRYSTAL AND ITS NONLINEAR OPTICAL DEVICES

[75] Inventors: Chen Chuangtian, Fuzhou; Wu Yicheng, Hefei; Jiang Aidong, Fuzhou; Wu Bochang, Fuzhou; You Guming, Fuzhou, all of China

[73] Assignee: Fujian Institute of Research on the Structure of Matter, Chinese Academy of Sciences, Fuzhou, China

Reexamination Request:
No. 90/002,292, Mar. 7, 1991

Reexamination Certificate for:
Patent No.: 4,826,283
Issued: May 2, 1989
Appl. No.: 5,895

[30] Foreign Application Priority Data
Apr. 14, 1988 [CN] China .............................. 88102084.2

[51] Int. Cl.$^5$ ............................ G02B 6/10; H03F 7/00
[52] U.S. Cl. ..................................... 385/130; 385/122; 385/141; 307/425; 307/427; 307/428; 307/430
[58] Field of Search ............... 350/96.12, 96.13, 96.34, 350/395; 307/425, 427, 428, 430, 424

[56] References Cited
PUBLICATIONS

Chuangtian et al., *Structure-Effect Relation Between Anionic Group and SHG in Boron-Oxygen Compounds Together with the Search for New Type SHG Materials;* Nonlinear Optical Materials, pp. 144-146.

*Primary Examiner*—Brian Healy

[57] ABSTRACT

This invention relates to NLO devices mae of LiB$_3$O$_5$ crystals, which can be used in a laser system of high power density and relatively large divergence and possess a character of high SHG conversion efficiency. Moreover the NLO devices (including waveguide devices) of this invention are capable of producing coherent harmonics of wavelength below 2000 Å and tolerating larger processing error of crystals.

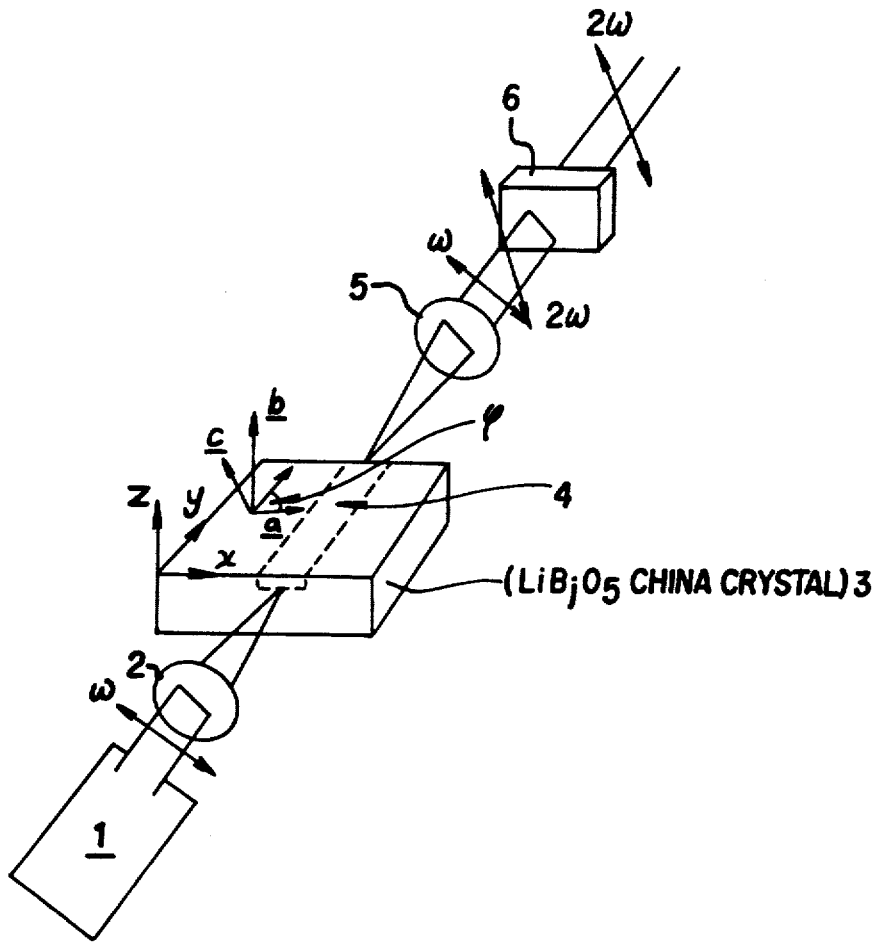

**REEXAMINATION CERTIFICATE
ISSUED UNDER 35 U.S.C. 307**

NO AMENDMENTS HAVE BEEN MADE TO THE PATENT

AS A RESULT OF REEXAMINATION, IT HAS BEEN DETERMINED THAT:

The patentability of claims 1–6 is confirmed.

* * * * *